US012685076B2

(12) United States Patent
Achkasov et al.

(10) Patent No.: US 12,685,076 B2
(45) Date of Patent: Jul. 14, 2026

(54) PRESSURE PUCK DIAGNOSTIC WAFER

(71) Applicant: Applied Materials, Inc., Santa Clara, CA (US)

(72) Inventors: Kostiantyn Achkasov, Lyons (FR); Peter Reimer, San Jose, CA (US); Shawn Thanhson Le, San Jose, CA (US); Sohrab Zokaei, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 954 days.

(21) Appl. No.: 17/522,635

(22) Filed: Nov. 9, 2021

(65) Prior Publication Data

US 2023/0141012 A1 May 11, 2023

(51) Int. Cl.
| | |
|---|---|
| *H01L 21/67* | (2006.01) |
| *G05B 19/418* | (2006.01) |
| *H10P 72/00* | (2026.01) |
| *H01J 37/32* | (2006.01) |

(52) U.S. Cl.
CPC .... *H10P 72/0612* (2026.01); *G05B 19/41875* (2013.01); *G05B 2219/45031* (2013.01); *H01J 37/32917* (2013.01); *H01J 2237/24585* (2013.01)

(58) Field of Classification Search
CPC .......... H01L 21/67276; H01L 21/6719; H01L 21/67248; H01L 21/67253; G05B 19/41875; G05B 2219/45031; H01J 37/32917; H01J 2237/24585; H01J 37/32935
See application file for complete search history.

(56) References Cited

U.S. PATENT DOCUMENTS

| | | | | |
|---|---|---|---|---|
| 6,244,121 B1 * | 6/2001 | Hunter | ................. | H01L 21/681 |
| | | | | 73/866.5 |
| 6,378,378 B1 | 4/2002 | Fisher | | |
| 6,807,503 B2 * | 10/2004 | Ye | .................... | H01L 21/67276 |
| | | | | 438/18 |

(Continued)

FOREIGN PATENT DOCUMENTS

| | | |
|---|---|---|
| JP | 2007536726 A | 12/2007 |
| JP | 2010519768 A | 6/2010 |

(Continued)

OTHER PUBLICATIONS

Application No. PCT/US2022/048823, International Search Report and Written Opinion, Mailed On Mar. 16, 2023, 9 pages.

(Continued)

*Primary Examiner* — Freddie Kirkland, III
(74) *Attorney, Agent, or Firm* — Kilpatrick Townsend & Stockton LLP LLP

(57) ABSTRACT

Exemplary diagnostic wafers for a semiconductor processing chamber may include a wafer body defining a plurality of recesses. The diagnostic wafers may include at least one data logging puck positionable within one of the plurality of recesses. The diagnostic wafers may include at least one battery puck positionable within one of the plurality of recesses. The diagnostic wafers may include at least one sensor puck positionable within one of the plurality of recesses.

20 Claims, 11 Drawing Sheets

(56)                References Cited

U.S. PATENT DOCUMENTS

| | | | | |
|---|---|---|---|---|
| 7,135,852 | B2 * | 11/2006 | Renken | H01L 21/681 |
| | | | | 438/5 |
| 7,149,643 | B2 * | 12/2006 | Renken | H01L 21/67253 |
| | | | | 702/122 |
| 7,233,874 | B2 * | 6/2007 | Ye | G01D 9/005 |
| | | | | 438/18 |
| 7,855,549 | B2 * | 12/2010 | Renken | H01L 21/67253 |
| | | | | 324/750.3 |
| 9,356,822 | B2 * | 5/2016 | Jensen | H04L 67/34 |
| 9,911,633 | B2 * | 3/2018 | Ang | B23K 3/087 |
| 10,083,883 | B2 * | 9/2018 | Tedeschi | H01L 22/14 |
| 10,720,350 | B2 * | 7/2020 | Nguyen | H01L 21/67253 |
| 10,861,682 | B2 * | 12/2020 | O'Banion | H01L 21/67109 |
| 10,879,046 | B2 * | 12/2020 | Boyd, Jr. | C23C 16/4586 |
| 11,284,018 | B1 * | 3/2022 | Ummethala | H04N 23/60 |
| 11,569,138 | B2 * | 1/2023 | Azarya | G05B 19/4184 |
| 11,589,474 | B2 * | 2/2023 | Criminale | H05K 7/1427 |
| 11,924,972 | B2 * | 3/2024 | Criminale | H01L 21/67259 |
| 2003/0115956 | A1 * | 6/2003 | Moehnke | H01L 21/67253 |
| | | | | 73/866.5 |
| 2004/0201231 | A1 | 10/2004 | Stacey | |
| 2004/0225462 | A1 * | 11/2004 | Renken | H01L 21/6732 |
| | | | | 702/94 |
| 2005/0011611 | A1 | 1/2005 | Mahoney et al. | |
| 2005/0125184 | A1 | 6/2005 | Ye et al. | |
| 2006/0234398 | A1 * | 10/2006 | Gluschenkov | H01L 21/67294 |
| | | | | 118/712 |
| 2007/0046284 | A1 * | 3/2007 | Renken | H01L 21/681 |
| | | | | 702/58 |
| 2007/0107523 | A1 * | 5/2007 | Galewski | G01L 9/0072 |
| | | | | 73/754 |
| 2008/0050847 | A1 * | 2/2008 | Gluschenkov | H01L 21/67294 |
| | | | | 340/657 |
| 2011/0074341 | A1 * | 3/2011 | Jensen | H02J 50/10 |
| | | | | 320/108 |
| 2012/0074514 | A1 * | 3/2012 | Nguyen | H01J 37/32935 |
| | | | | 257/467 |
| 2014/0007669 | A1 * | 1/2014 | Akada | G01F 1/6845 |
| | | | | 73/170.01 |
| 2016/0370797 | A1 | 12/2016 | Azarya et al. | |
| 2017/0221775 | A1 * | 8/2017 | Tedeschi | H01L 21/67253 |
| 2019/0006157 | A1 * | 1/2019 | O'Banion | H01L 21/67109 |
| 2020/0075370 | A1 | 3/2020 | Potter et al. | |
| 2021/0242057 | A1 | 8/2021 | Lee et al. | |
| 2023/0345137 | A1 * | 10/2023 | Ummethala | H01L 21/67276 |
| 2023/0413446 | A1 * | 12/2023 | Criminale | H05K 1/183 |

FOREIGN PATENT DOCUMENTS

| | | |
|---|---|---|
| JP | 2011059132 A | 3/2011 |
| JP | 2013539914 A | 10/2013 |
| JP | 2020500415 A | 1/2020 |
| KR | 20200029879 A | 3/2020 |
| TW | 200625371 A | 7/2006 |
| TW | 200625496 A | 7/2006 |
| TW | 200802521 A | 1/2008 |
| TW | 201720237 A | 6/2017 |
| TW | 201727798 A | 8/2017 |
| WO | 2006080423 A1 | 8/2006 |

OTHER PUBLICATIONS

Japanese Application No. 2024-527301, Office Action mailed on May 27, 2025, 11 pages (6 pages of original document and 5 pages of English Translation).

Korean Application No. KR10-2024-7019121, Notice of Decision to Grant mailed on Aug. 11, 2025, 2 pages.

Korean Application No. KR10-2024-7019121, Office Action mailed on Apr. 16, 2025, 8 pages.

International Application No. PCT/US2022/048823, International Preliminary Report on Patentability mailed on May 23, 2024, 6 pages.

Taiwanese Application No. 111142350, Notice of Decision to Grant mailed on Mar. 27, 2025, 4 pages (2 pages of original document and 2 pages of English Translation).

Taiwanese Application No. Application No. 111142350, Office Action mailed on Dec. 16, 2024, 11 pages.

Taiwanese Application No. Application No. 111142350, Office Action mailed on Aug. 2, 2023, 12 pages (11 pages of original document and 1 page of English Translation).

Taiwanese Application No. Application No. 111142350, Office Action mailed on Oct. 12, 2023, 14 pages.

Taiwanese Application No. Application No. 111142350, Office Action mailed on Dec. 7, 2023, 5 pages.

Japanese Application No. 2024-527301, Notice of Decision to Grant mailed on Nov. 25, 2025, 5 pages (2 pages of English Translation and 3 pages of original documents).

* cited by examiner

400

402

404

500

506

502

504

700

724

726

702

706

704

712a

722

712b

712c

720

722

706

1000

PRESSURE PUCK DIAGNOSTIC WAFER

TECHNICAL FIELD

The present technology relates to components and apparatuses for monitoring conditions within a semiconductor processing chamber. More specifically, the present technology relates to a diagnostic wafer (or instrumented wafer) that is able to detect operating conditions during semiconductor processing operations.

BACKGROUND OF THE INVENTION

Integrated circuits are made possible by processes which produce intricately patterned material layers on substrate surfaces. Producing patterned material on a substrate requires controlled methods for forming and removing material. To produce a desired film profile on a substrate, it may be necessary to maintain certain operating conditions within the chamber. For example, the temperature, pressure, gas/plasma flow, and/or other conditions may need to be carefully controlled to provide a desired film profile on a substrate surface. It may therefore be advantageous to monitor semiconductor processing chambers to ensure that the operating conditions within the chamber are within predefined parameters to produce a desired film profile on substrate surfaces.

Thus, there is a need for improved semiconductor processing chamber monitoring tools that can be used to ensure that desired operating conditions are maintained during one or more semiconductor processing operations. These and other needs are addressed by the present technology.

BRIEF SUMMARY OF THE INVENTION

Exemplary diagnostic wafers for a semiconductor processing chamber may include a wafer body defining a plurality of recesses. The diagnostic wafers may include at least one data logging puck positionable within one of the plurality of recesses. The diagnostic wafers may include at least one battery puck positionable within one of the plurality of recesses. The diagnostic wafers may include at least one sensor puck positionable within one of the plurality of recesses.

In some embodiments, each of the at least one battery puck may include a plurality of batteries. Each of the at least sensor puck may include at least one sensor selected from the group consisting of: temperature sensors, pressure sensors, retarding field energy analyzers (RFEA), plasma probes, optical emission probes for plasma diagnostics, visible light sensors, IR light sensors/cameras. At least some of the at least one data logging puck, the at least one battery puck, and the at least one sensor puck may include an alignment mechanism that properly orient a respective puck within one of the plurality of recesses. The wafer may include a bus that couples each of the at least one battery puck, the at least one sensor puck, and the at least one data logging puck. At least some of the at least one data logging puck, the at least one battery puck, and the at least one sensor puck may include a ceramic coating. The at least one sensor puck may include a plurality of sensor pucks. Each of the plurality of sensor pucks may include a same type of sensor. The at least one sensor puck may include a plurality of sensor pucks. Each of the plurality of sensor pucks may include a different type of sensor. The at least one data logging puck, the at least one battery puck, and the at least one sensor puck may each be insertable within any of the plurality of recesses.

Some embodiments of the present technology may encompass diagnostic wafers for a semiconductor processing chamber. The diagnostic wafers may include a wafer body defining a plurality of recesses. Each of the plurality of recesses may include a plurality of electrical contacts. The wafer body may include a connection circuit that electrically couples the plurality of electrical contacts of each of the plurality of recesses with the plurality of electrical contacts of at least one other of the plurality of recesses. The diagnostic wafers may include a plurality of battery pucks positionable within one of the plurality of recesses. The diagnostic wafers may include a plurality of sensor pucks positionable within one of the plurality of recesses.

In some embodiments, at least one of the plurality of battery pucks may include a status LED. At least one of the plurality of sensor pucks comprises a status LED. One or both of the wafer body and the plurality of sensor pucks may include a wireless antenna. A thickness of each of the plurality of sensor pucks may match a depth of each of the plurality of recesses.

Some embodiments of the present technology may encompass methods of monitoring conditions within a semiconductor processing chamber. The methods may include positioning a diagnostic wafer on a substrate support of a semiconductor processing chamber. The diagnostic wafer may include a wafer body defining a plurality of recesses. The diagnostic wafer may include at least one data logging puck positionable within one of the plurality of recesses. The diagnostic wafer may include at least one battery puck positionable within one of the plurality of recesses. The diagnostic wafer may include at least one sensor puck positionable within one of the plurality of recesses. The methods may include performing one or more processing operations within the semiconductor processing chamber. The methods may include monitoring at least one operating condition within the semiconductor processing chamber using the at least one sensor puck.

In some embodiments, the methods may include recording data associated with the at least one operating condition using the at least one data logging puck. The methods may include accessing the data from the at least one data logging puck at a remote computing device. The methods may include transmitting data associated with the at least one operating condition to a computing device outside the semiconductor processing chamber. The at least one operating condition may include one or more selected from the group consisting of a temperature within the semiconductor processing chamber, a pressure within the semiconductor processing chamber, an ion and electron current within the semiconductor processing chamber, an ion and electron energy within the semiconductor processing chamber, a plasma potential within the semiconductor processing chamber, and a light emission within the semiconductor processing chamber. The at least one battery puck may be operated in a pulse mode.

Such technology may provide numerous benefits over conventional systems and techniques. For example, embodiments of the present technology may provide diagnostic wafers that include a number of removable sensor pucks. The diagnostic wafers provide customizable solutions for monitoring various operating conditions within a semiconductor processing chamber. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
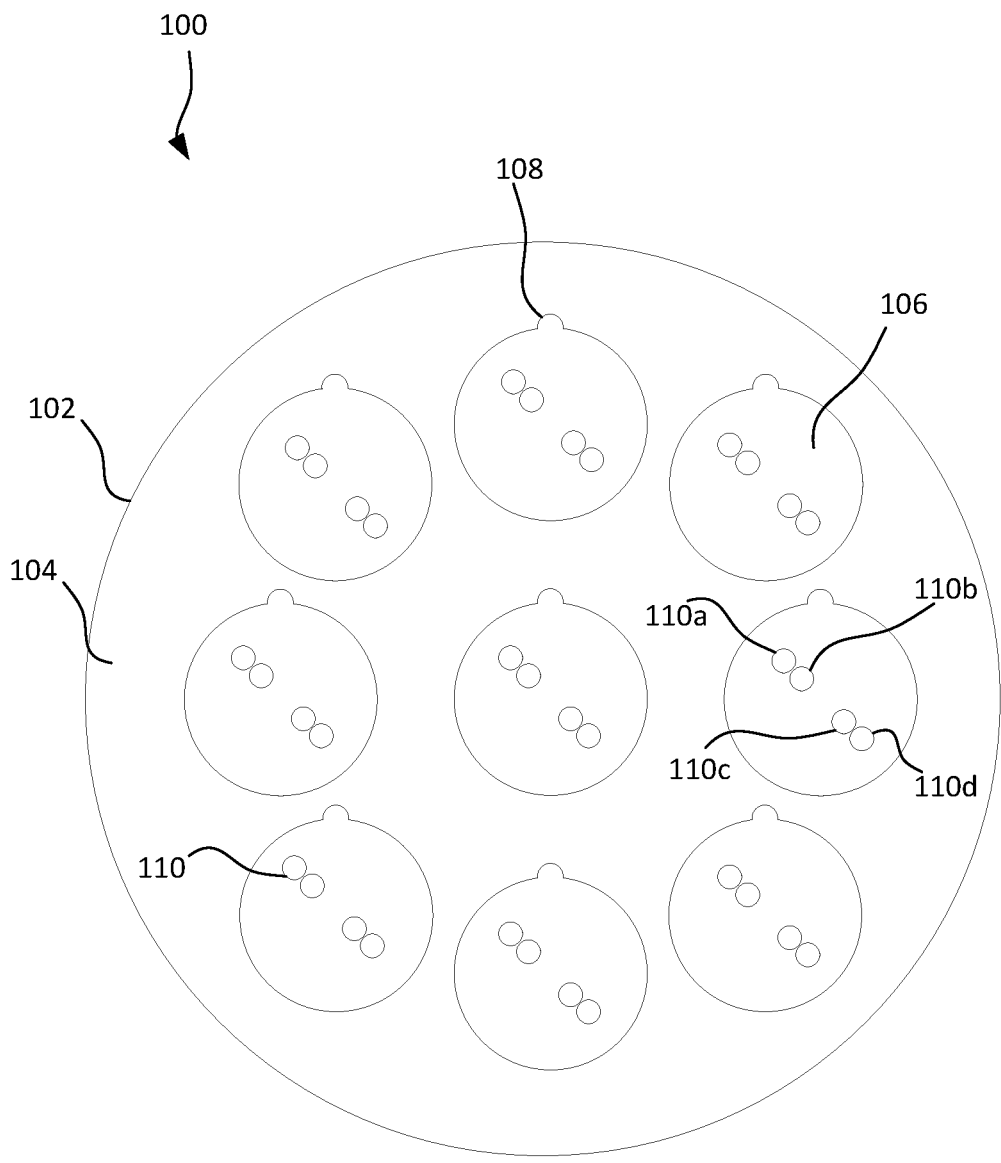
FIG. 1A shows a top plan view of a diagnostic wafer according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Semiconductor substrate processing operations are performed under carefully controlled operating conditions, as factors such as temperature, pressure, gas/plasma flow, etc. may impact deposition rates and uniformity across the substrate. To ensure that the operating conditions satisfy the necessary parameters, some conventional chambers integrate one or more sensors into chamber components. However, as these sensors are positioned away from the substrate location, readings from the sensors are not indicative of conditions at the surface of the substrate itself. Additionally, the presence of such sensors may disrupt chamber conditions, such as by interfering with gas/plasma flow and/or pressure within the chamber. To address these issues, some systems may utilize diagnostic wafers that include one or more sensors. These wafers may mimic the size and shape of a semiconductor substrate. However, such wafers may be difficult and/or time consuming to manufacture. Additionally, if one sensor on a wafer fails, the entire wafer must be removed from operation for replacement or repair.

The present technology overcomes these challenges by providing diagnostic wafers that include a number of removable sensor pucks. The diagnostic wafers may mimic semiconductor substrates and may be positioned on a substrate support during one or more processing operations to monitor the conditions within a semiconductor processing chamber. As the sensor pucks are removable, each wafer may be configurable in any number of different arrangements to monitor a desired set of conditions within the chamber. Moreover, if one sensor puck fails or is damaged, only that sensor puck need be taken out of operation, while the remaining pucks and wafer may continue to be used. Additionally, the individual pucks may charge faster than a conventional wafer, which may reduce downtime. In some embodiments, the battery pucks may be pre-charged, with may enable quick replacement in the field. Manufacture of the individual pucks may be simpler and quicker than the construction of a conventional wafer.

Although the remaining disclosure will routinely identify diagnostic wafers and pucks utilizing the disclosed technology, it will be readily understood that the systems and methods are equally applicable to other chamber diagnostic systems. Accordingly, the technology should not be considered to be so limited as for use with specific semiconductor chambers or systems. The disclosure will discuss a number of possible diagnostic wafers and pucks according to embodiments of the present technology before additional variations and adjustments to this system according to embodiments of the present technology are described.

FIG. 1A illustrates a top plan view of an exemplary embodiment of a diagnostic wafer 100. Diagnostic wafer 100 may include a wafer body 102 that forms an exterior of the diagnostic wafer 100 and houses internal components of the diagnostic wafer 100. The wafer body 102 may be sized and shaped to mimic a semiconductor substrate, however the wafer body 102 may have any shape and/or size in various embodiments. For example, the wafer body 102 may be generally circular, elliptical, rectangular, and/or may have any other shape. In some embodiments, the wafer body 102 may have a diameter of between or about 50 mm and 500 mm, between or about 100 mm and 400 mm, or between or about 200 and 300 mm, however wafer body 102 may have a larger or smaller diameter in some embodiments. Oftentimes, the wafer body 102 may have a thickness of less than or about 10 mm, less than or about 9 mm, less than or about 8 mm, less than or about 7 mm, less than or about 6 mm, less than or about 5 mm, less than or about 4 mm, less than or about 3 mm, or less. The wafer body 102 may be formed from one or more pieces. For example, the wafer body 102 may include a top plate and a bottom plate, with a number of electrical components disposed between the top plate and bottom plate. In other embodiments, the electronic components may be positioned within a single piece wafer body 102, such as a wafer body 102 that is formed about the electronic components. The wafer body 102 may be formed from various materials that are compatible with semiconductor chambers. For example, the wafer body 102 may be formed from a metallic and/or ceramic material, such as, but not limited to, aluminum and/or aluminum oxide. In other embodiments, the wafer body 102 may include other materials that are compatible with semiconductor chambers such as FR4, polyamides, printed circuit board (PCB) materials, and the like.

A top surface 104 of the wafer body 102 may define a number of recesses 106. The recesses 106 may serve as seating locations for one of a number of pucks. Each recess 106 may be defined by a base and at least one sidewall formed within the wafer body 102. Oftentimes, each of the recesses 106 may have the same size and shape, which may enable various pucks to be inserted in any or almost any respective recess 106 on the wafer body 102 to provide maximum flexibility in puck/sensor arrangements. In other embodiments, some or all of the recesses 106 may have different sizes and/or shapes to accommodate specific types of pucks. The recesses 106 may be any shape. For example, the recesses 106 may have generally circular shapes, generally elliptical shapes, generally rectangular shapes, and/or other polygonal shapes. The recesses 106 may each have diameters of less than or about 70 mm, less than or about 60 mm, less than or about 50 mm, less than or about 40 mm, less than or about 30 mm, or less. In some embodiments, a depth of the recesses 106 may be less than or about 6 mm, less than or about 5 mm, less than or about 4 mm, less than or about 3 mm, less than or about 2 mm, less than or about 1 mm, or less.

The wafer body 102 may define any number of recesses 106. For example, the wafer body 102 may define at least or about 3 recesses, at least or about 4 recesses, at least or about 5 recesses, at least or about 6 recesses, at least or about 7 recesses, at least or about 8 recesses, at least or about 9 recesses, at least or about 10 recesses, at least or about 15 recesses, at least or about 20 recesses, or more. The recesses 106 may be arranged in any layout about the top surface 104 of the wafer body 102. For example, the recesses 106 may be arranged at regular and/or irregular intervals about the top surface 104 of the wafer body 102. In some embodiments the recesses 106 may be symmetrically arranged about the top surface 104. The recesses 106 may be arranged in one or more concentric rings in various embodiments.

Some or all of the recesses 106 may include one or more alignment features that may help enable the pucks to be quickly and properly oriented within a given recess 106. As just one example, a sidewall of each recess 106 may include one or more notches 108 that protrude out from the recess 106 and/or nubs (not shown) that protrude into a center of the recess 106. This may enable a corresponding alignment feature of a puck to be properly oriented within the recess 106. Proper orientation of the puck within the recess 106 may ensure that electrical connectors of each component are properly aligned and engaged when the puck is seated within the recess 106. While shown with one notch 108 it will be appreciated that any number of notches, nubs, and/or other alignment features may be provided on a given recess 106. Oftentimes, the alignment features may be arranged asymmetrically about the recess 106, which ensures that a puck may only be inserted within a recess 106 in a single orientation.

Each recess 106 may include a number of electrical contacts 110, such as feedthrough connectors. In some embodiments, the electrical contacts 110 may include pressfit receptacles that may receive feedthrough connectors of a puck. The electrical contacts 110 may be provided in a bottom surface of each recess 106 as shown here, and/or may be provided in one or more sidewalls of the recess 106. The electrical contacts 110 may interface with corresponding connectors on the various pucks to facilitate the transfer of power and/or data between the various pucks. For example, a number of wires, an electrical bus, and/or other circuitry may be used to connect the electrical contacts 110 from a number of the recesses 106 to facilitate the exchange of data and/or power between the various recesses 106. In some embodiments, rather than using physical connections, power and/or data may be exchanged between the pucks/recesses 106 wirelessly using known wireless protocols. The various electrical contacts 110 may include one or more connectors dedicated to data exchange and one or more connectors dedicated to power transfer. As illustrated, each recess includes a data receiver electrical contact 110a, a data transmitter electrical contact 110b, a positive battery terminal electrical contact 110c, and a negative battery terminal electrical contact 110d. While shown in a given order it will be appreciated that the electrical contacts 110 may be provided in any order. Additionally, while linearly arranged in FIG. 1A, it will be appreciated that the electrical contacts 110 may be arranged in any pattern within the recess 106. While shown with four electrical contacts 110 within each recess 106, more or fewer electrical contacts 110 may be provided in various embodiments. In some instances, one or more of the recesses 106 may have different numbers and/or arrangements of electrical contact 110 than other recesses 106.

The electrical contacts 110 may take many forms. For example, the electrical contacts 110 may include spring-loaded contacts, while in other embodiments, the electrical contacts 110 may include pins and/or ports that interface with corresponding connectors on the pucks. It will be appreciated that any form of electrical connectors may be utilized as electrical contacts 110 in various embodiments. The electrical contacts 110 may be formed from conductive materials that are compatible with semiconductor processing chambers (such as those materials already present in the chamber components). Such materials may need to exhibit minimal (e.g., less than 10%) or no resistivity changes over a large temperature range (such as from room temperature up to at least 200° C.) and/or may exhibit low thermal expansion. For example, the materials for the electrical contacts 110 may have coefficients of linear thermal expansion of less than or about 30, less than or about 25, less than or about 20, less than or about 15, less than or about 10, less than or about 5, or less. Possible materials may include nickel, stainless steel, aluminum, Kovar, and the like. In some embodiments, a ceramic material (such as alumina or glass) may be provided within the recess 106 to isolate the various electrical contacts 110.

Figure 1B:
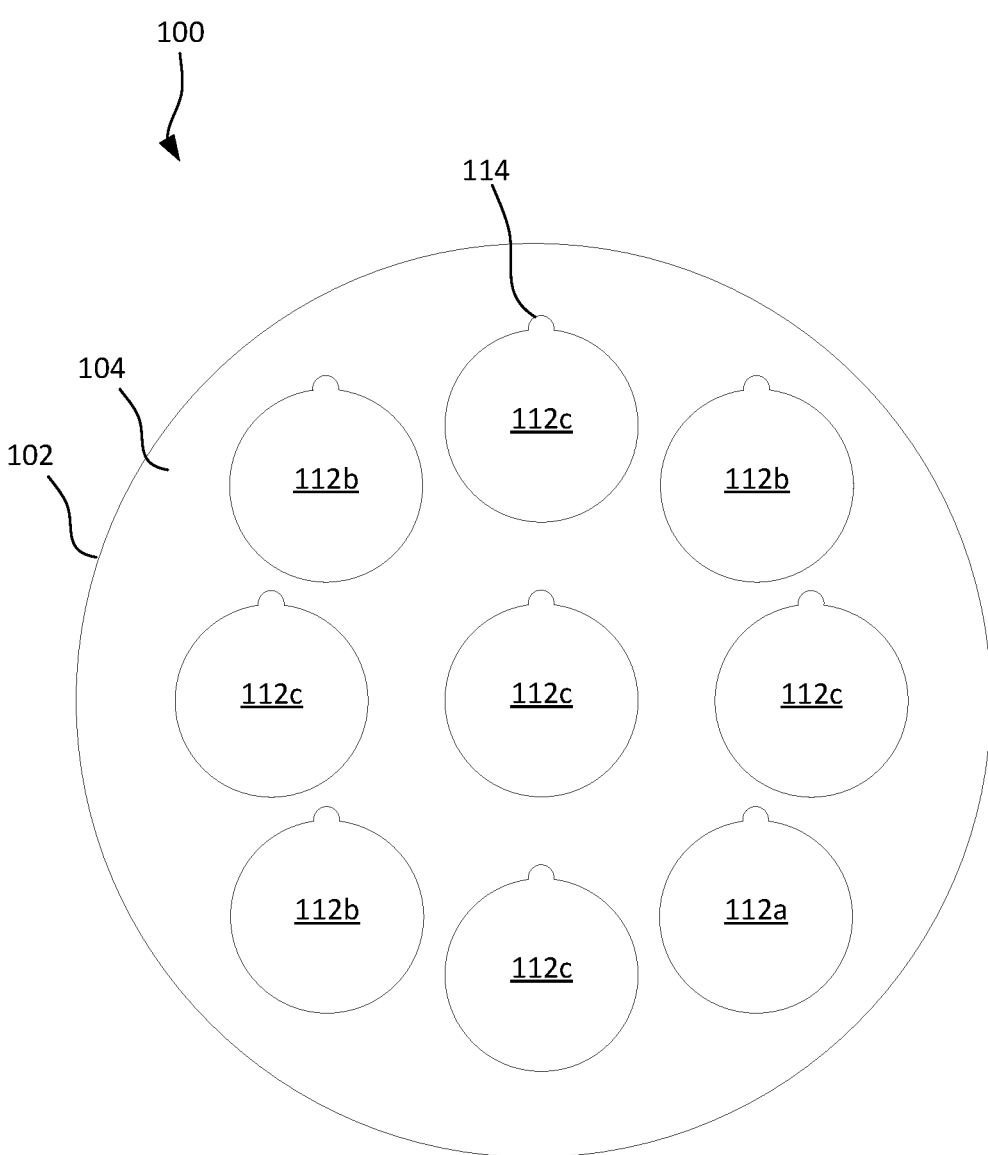
FIG. 1B shows a top plan view of the diagnostic wafer of FIG. 1A with a number of sensor pucks.

FIG. 1B illustrates a top plan view of a number of pucks 112 being seated within recesses 106 of diagnostic wafer 100. The pucks 112 may be removably inserted within the recesses 106 such that individual ones of the pucks 112 may be removed for repair, replacement, charging, and/or other reason. By making the pucks 122 removable, the configuration of different pucks 112 may be adapted to meet the needs of a particular monitoring application while enabling the same diagnostic wafer 100 to be utilized. The pucks 112 may include at least one data logging puck 112a (which may be optional in some embodiments, as discussed in greater detail below), at least one battery puck 112b, and at least one sensor puck 112c. Each sensor puck 112c may include one or more sensors that may monitor operating conditions within a semiconductor processing chamber. For example, sensor pucks 112c may include one or more sensors, including temperature sensors, pressure sensors (including Pirani micro electro-mechanical system (MEMS) sensors, piezo-electric transducers, capacitance diaphragms, etc.), retarding field energy analyzers (RFEA), plasma probes (Langmuir, hairpin, etc.), optical emission probes for plasma diagnostics, visible light sensors, IR light sensors/cameras, and/or other sensors. The data logging puck 112a may include a storage device and potentially a wireless data transmission device, and may collect data from each of the sensor pucks 112c for analysis of the conditions within a semiconductor processing chamber, while the battery pucks 112b provide power to each of the sensor pucks 112c and data logging pucks 112a.

Each of the pucks 112 may be sized and shaped to be received within a respective one of the recesses 106 of the diagnostic wafer 100. For example, each puck 112 may be generally circular in shape and may have a diameter that matches that of a generally circular recess 106. A thickness of each puck 112 may substantially match a depth of the recesses 106. This may help ensure that the top surface of each puck 112 is flush or substantially flush with the top surface 104 of the diagnostic wafer 100, which enables the diagnostic wafer 100 to better mimic a semiconductor substrate and to prevent the diagnostic wafer 100 from perturbing the chamber conditions during processing/testing operations. Each puck 112 may include a nub 114 and/or other alignment feature that may be used to properly orient the puck 112 within the recess 106. As just one example, the nub 114 may be aligned with and inserted within notch 108 of the recess 106 to properly align the puck 112 within the recess 106. Proper alignment may ensure that a number of electrical contacts (not shown) of the puck 112 are properly aligned with the electrical contacts 110 of a given recess 106. In some embodiments, some or all of the outer surface of the pucks 112 may include a ceramic material, such as a ceramic coating. For example, a ceramic material (such as a coating, plate, etc.) may be provided proximate the electrical contacts of the puck 112 to help isolate the electrical contacts. Ceramic coating of the sensor may help the sensor to better withstand the harsh semiconductor process environment. The coating may be done via an atomic layer deposition (ALD) and/or another type of thin film deposition process. The coating may be also applied to the puck body 102 and/or the electronics (in which case the coating may be a polymer coating such as polypropylene).

As illustrated, the diagnostic wafer 100 includes one data logging puck 112a that is coupled with three battery pucks 112b and five sensor pucks 112c, however the diagnostic wafer 100 may include any number of each type of puck 112 in various embodiments and may omit the data logging puck 112a in some embodiments. In some embodiments, each of the recesses 106 may receive a puck 112, while in other instances one or more of the recesses 106 may be empty. In some embodiments, rather than leaving a recess 106 empty, a dummy puck (e.g., a blank puck body) may be positioned with the recess 106. This may be done to ensure that the top surface of the puck 112 is substantially flat so as to not interfere with fluid flow and/or pressure distribution within the chamber. The pucks 112 may be provided in any arrangement within the diagnostic wafer 100 to meet the particular monitoring needs of a particular testing operation. Oftentimes, the sensor pucks 112c may be symmetrically arranged about the diagnostic wafer 100, however asymmetric arrangements may be utilized in some instances. In some embodiments, each of the sensor pucks 112c used may include a same type of sensor, while in other embodiments at least one of the sensor pucks 112c includes a sensor that is different than the sensor in at least one other sensor puck 112c. For example, in some embodiments, one or more sensor pucks 112c may include a Pirani pressure and temperature sensor, one or more sensor pucks 112c may include a piezoelectric transducer pressure sensor, and one or more sensor pucks 112c may include an optical sensor. In some embodiments, a single sensor puck 112c may include multiple of the same and/or different type of sensor.

In some embodiments, one or more of the pucks 112 may include one or more status indicators. For example, some or all of the pucks 112 may include a status light emitting diode (LED) that may be illuminated to show a status of the respective puck 112. As just one example, a status LED on a battery puck 112b may illuminate green when the battery puck 112b has a high level of charge (e.g., greater than 50%), yellow when the battery puck 112b has a moderate level of charge (e.g., between 10%-50%), and red when the battery puck 112b has a low level of charge (e.g., 0%-10%). Additionally, during charging, the battery puck 112b may show a flashing light until the battery puck 112b is fully charged, at which point the status LED may be illuminated in a steady state. Status LEDs on the data logger puck 112a and/or sensor pucks 112c may illuminate with a predetermined color and/or pattern (e.g., steady, flashing, etc.) and/or turn off when the particular puck 112 is performing a given operation (logging data, measuring an operating condition, etc.) and/or when at rest.

The use of diagnostic wafers having a number of interchangeable pucks provides a robust solution for monitoring operating conditions within a substrate processing chamber. For example, the number and selection of sensor pucks may enable any number of chamber conditions to be monitored at the location of a semiconductor substrate, without perturbing chamber conditions. Such diagnostic wafers may enable measurements of conditions (such as pressure and/or temperature distribution) in semiconductor chambers by using a diagnostic disc similar in size and shape to a wafer. Such wafers enable individual pucks to be replaced and/or removed, such as in the event of failure, without affecting the rest of the wafer and/or other pucks. Each battery puck may be charged individually, which may result in shorter charging/downtimes for each puck. The battery pucks may be charged by a dedicated charging station (ex-situ) and/or wirelessly (in-situ). Wireless in-situ charging may enable the diagnostic wafer to be kept in place within a chamber and avoid transfers and/or air exposure of the chamber. Additionally, such features provide a flexible testing platform that enables users to mix and match sensors to create custom sensor configurations for particular testing operations.

Figure 2:
FIG. 2 shows a wiring diagram of a diagnostic wafer according to some embodiments of the present technology.
Figure 2:
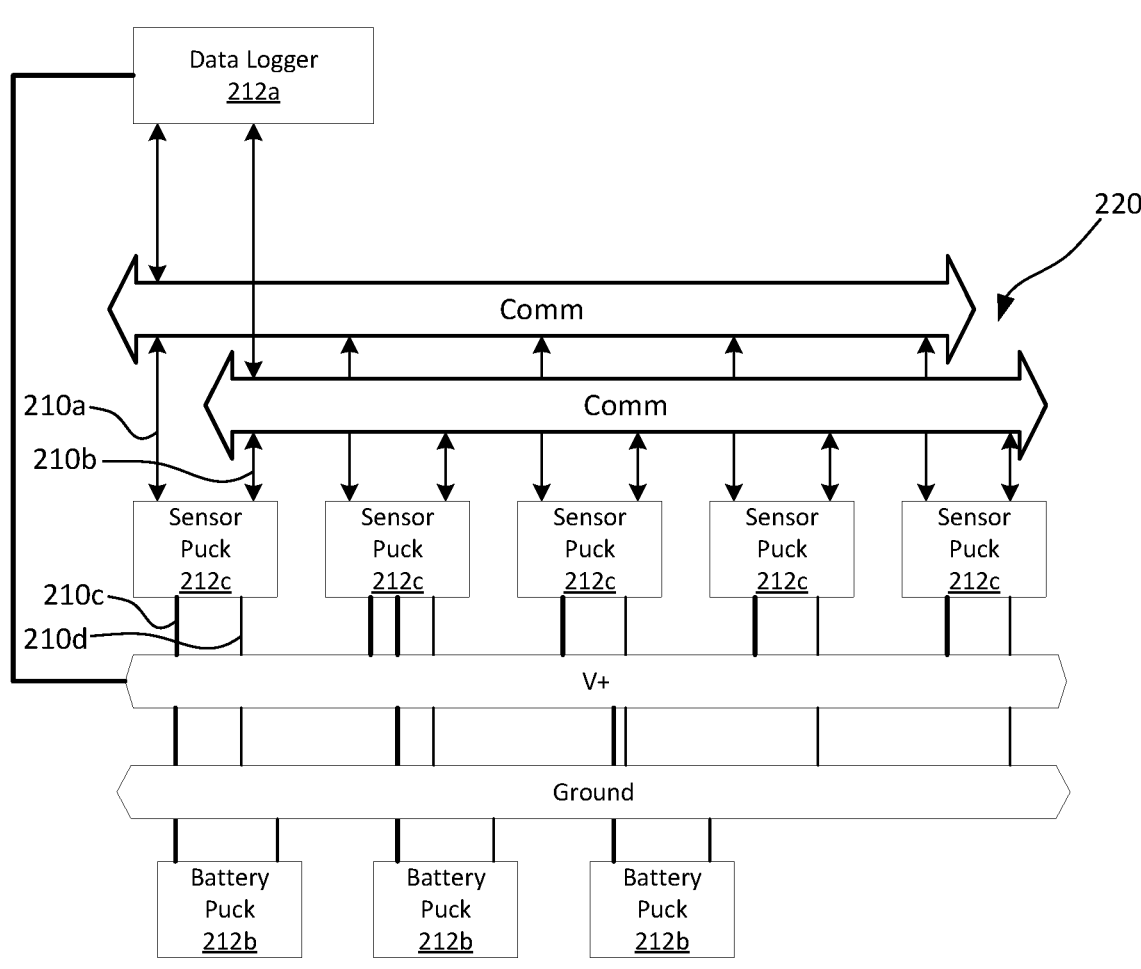

FIG. 2 shows a wiring diagram of a diagnostic wafer 200 according to some embodiments of the present technology. FIG. 2 may include one or more components discussed above with regard to FIGS. 1A and 1B, and may illustrate further details relating to that diagnostic wafer 100. Diagnostic wafer 200 is understood to include any feature or aspect of diagnostic wafer 100 discussed previously. For example, diagnostic wafer 200 may include a wafer body that defines a number of recesses that may each receive one of a number of pucks 212. Diagnostic wafer 200 may include a number of electrical contacts 210 that are each coupled with a bus 220 or other connection circuit that may be used to electrically couple the various pucks 212 together. For example, each recess may include two (or more) connectors dedicated to data exchange and two (or more)

connectors dedicated to power transfer. As illustrated, each sensor puck 212c may be positioned within a recess that includes a data receiver electrical contact 210a, a data transmitter electrical contact 210b, a positive battery terminal electrical contact 210c, and a negative battery terminal electrical contact 210d. The bus 220 may include circuit elements (such as wires, optical fibers, and the like) that extend between the various electrical contacts 210 to couple the electrical contacts 210 of the various recesses together to facilitate power and/or data transmission between the recesses. For example, circuit elements may couple receiver and/or transmitter electrical contacts 210a,b of each sensor puck 212c with a recess that holds a data logger puck 212a (which may be positioned in any of the recesses in some embodiments). Circuit elements may couple negative and positive terminals of each of a number of battery pucks with positive and negative battery electrical contacts 210c,d of each recess to facilitate power transfer from the battery pucks 212b to the data logger pucks 212a and/or sensor pucks 212c. It will be appreciated that the wiring diagram in FIG. 2 is merely one example and that various wiring configurations may be used to electrically couple the various recesses and pucks 212 of a diagnostic wafer 200. In some embodiments, a timer may be embedded and/or otherwise incorporated into the data logger puck 212a and/or the diagnostic wafer body. The timer may distribute the power to the sensor pucks 212c in a pulse mode (sending a trigger signal to start and stop the measurement). In some embodiments, a data-logger puck 212a may be operated in a same power mode as the other pucks 212 (e.g., all pucks 212 in pulse mode), while in other embodiments the data-logger puck 212a may be operated in a power mode that is independent of the other pucks. For example, the sensor pucks 212c may be operated in pulse mode while the data-logger puck 212a is operated in a continuous power mode.

Figure 3:
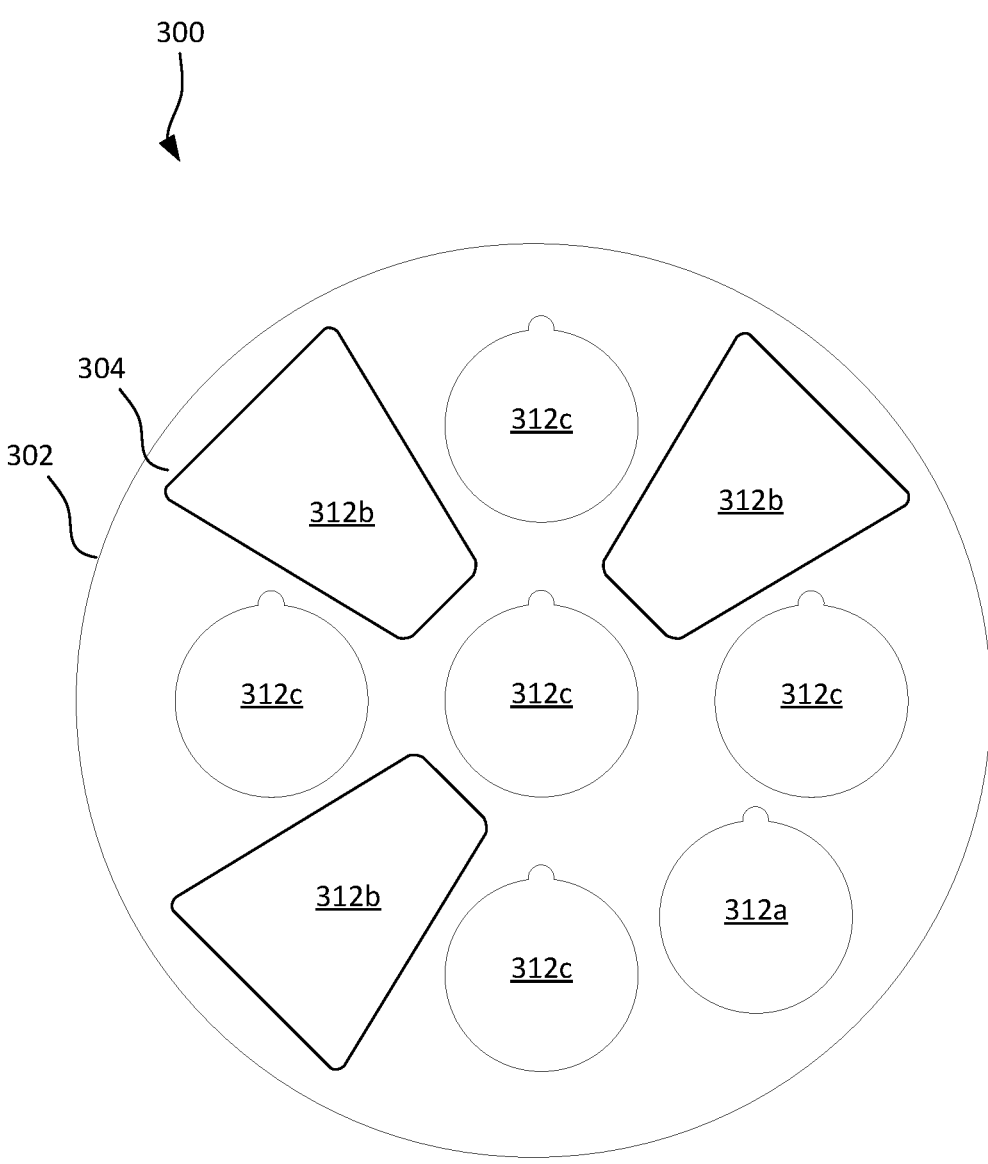
FIG. 3 shows a top plan view of a diagnostic wafer according to some embodiments of the present technology.

In some embodiments, one or more of the pucks of a diagnostic wafer may have different sizes and/or shapes. FIG. 3 illustrates a top plan view of an exemplary embodiment of a diagnostic wafer 300. FIG. 3 may include one or more components discussed above with regard to FIGS. 1A and 1B, and may illustrate further details relating to that diagnostic wafer 100. Diagnostic wafer 300 is understood to include any feature or aspect of diagnostic wafer 100 discussed previously. For example, diagnostic wafer 300 may include a wafer body 302 that defines a number of recesses that may each receive one of a number of pucks 312. A top surface 304 of the wafer body 302 may define a number of recesses that may serve as seating locations for one of a number of pucks 312. The recesses may be any shape. For example, the recesses that receive a data-logger puck 312a and/or a sensor puck 312c may have generally circular shapes, while recesses for battery pucks 312b may have generally trapezoidal shapes (regular and/or irregular, possibly with rounded corners). The generally trapezoidal recesses may be larger than the circular recesses and may enable larger and/or more powerful battery pucks 312b to be interfaced with the diagnostic wafer 300. By utilizing irregular trapezoidal shaped recesses as illustrated, the battery pucks 312b may be insertable within the recesses in only a single orientation, which may eliminate the need for other alignment mechanisms. While shown with a smaller top side of the generally trapezoidal battery pucks 312b facing a center of the wafer body 302, it will be appreciated that the battery pucks 312b and corresponding recesses may be oriented in any direction on the top surface 304 of the wafer body 302. However, by orienting the battery pucks 312b and corresponding recesses, the larger end of the generally trapezoidal shape may be positioned proximate the outer periphery of the wafer body 302, which may enable larger battery pucks 312b to be fit on the wafer body 302. Larger battery pucks 312b may include larger and/or greater numbers of batteries and may be able to power the data logger pucks 312a and sensor pucks 312c for longer durations.

As illustrated, the diagnostic wafer 300 includes one data logging puck 312a that is coupled with three battery pucks 312b and five sensor pucks 312c, however the diagnostic wafer 300 may include any number of each type of puck 312 in various embodiments. The pucks 312 may be provided in any arrangement within the diagnostic wafer 300 to meet the particular monitoring needs of a particular testing operation. Oftentimes, the sensor pucks 312c may be symmetrically arranged about the diagnostic wafer 300, however asymmetric arrangements may be utilized in some instances. In some embodiments, each of the sensor pucks 312c used may include a same type of sensor, while in other embodiments at least one of the sensor pucks 312c includes a sensor that is different than the sensor in at least one other sensor puck 312c. For example, in some embodiments, one or more sensor pucks 312c may include a Pirani pressure and temperature sensor, one or more sensor pucks 312c may include a piezoelectric transducer pressure sensor, and one or more sensor pucks 312c may include an optical sensor. In some embodiments, a single sensor puck 312c may include multiple of the same and/or different type of sensor.

Figure 4:
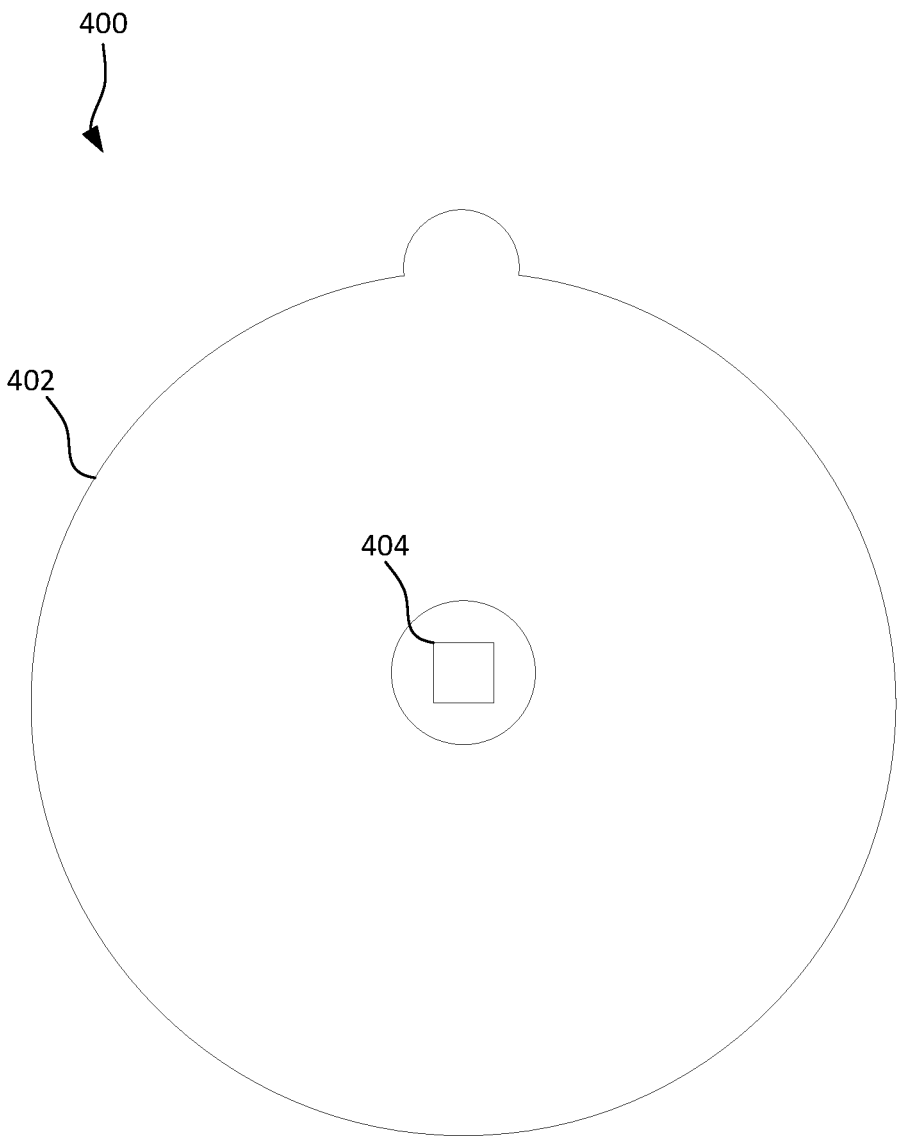
FIG. 4 shows a top plan view of a sensor puck according to some embodiments of the present technology.

FIG. 4 illustrates a top plan view of a sensor puck 400 according to some embodiments of the present technology. FIG. 4 may include one or more components discussed above with regard to FIGS. 1A and 1B, and may illustrate further details relating to that diagnostic wafer 100 or 300. Sensor puck 400 is understood to include any feature or aspect of sensor puck 112c or 312c discussed previously. Sensor puck 400 may include a puck body 402 that houses one or more sensors 404. The puck body 402 may be dimensioned to be received within a recess of a diagnostic wafer, such as diagnostic wafer 100 or 200 described above. A bottom surface of the puck body 402 may include a number of electrical contacts (not shown) that are used to electrically couple the sensor puck 400 with the diagnostic wafer. The sensors 404 may be disposed within a top surface of the puck body 402, such that a top surface of a sensor header may be exposed through the top surface of the puck body 402. While shown with a single sensor 404 centered about the top surface of the puck body 402, it will be appreciated that one or more sensors 404 may be arranged at any location of the puck body 402. The sensors 404 on a sensor puck 400 may all be the same type of sensor, or the sensor puck 400 may include multiple types of sensors. The sensors may be selected from temperature sensors, pressure sensors (including Pirani micro electro-mechanical system (MEMS) sensors, piezoelectric transducers, capacitance diaphragms, etc.), retarding field energy analyzers (RFEA), plasma probes (Langmuir, hairpin, etc.), optical emission probes for plasma diagnostics, visible light sensors, IR light sensors/cameras, and/or other sensors. In some embodiments, some or all of the puck body 402 may be formed from and/or coated with a dielectric and/or composite material that is chemically resistant (such as a ceramic material or a polymer coating). For example, a chemically resistant material may be applied via atomic layer deposition and/or other process to one or more surfaces of the puck body 402. Such a coating may help protect the sensor puck 400 and/or sensor 404 from chemical interactions that may cause degradation and/or erosion of the puck body 402 and/or sensor 404. In some embodiments, only the sensor header may be coated, rather than the entire puck body 402.

Figure 5:
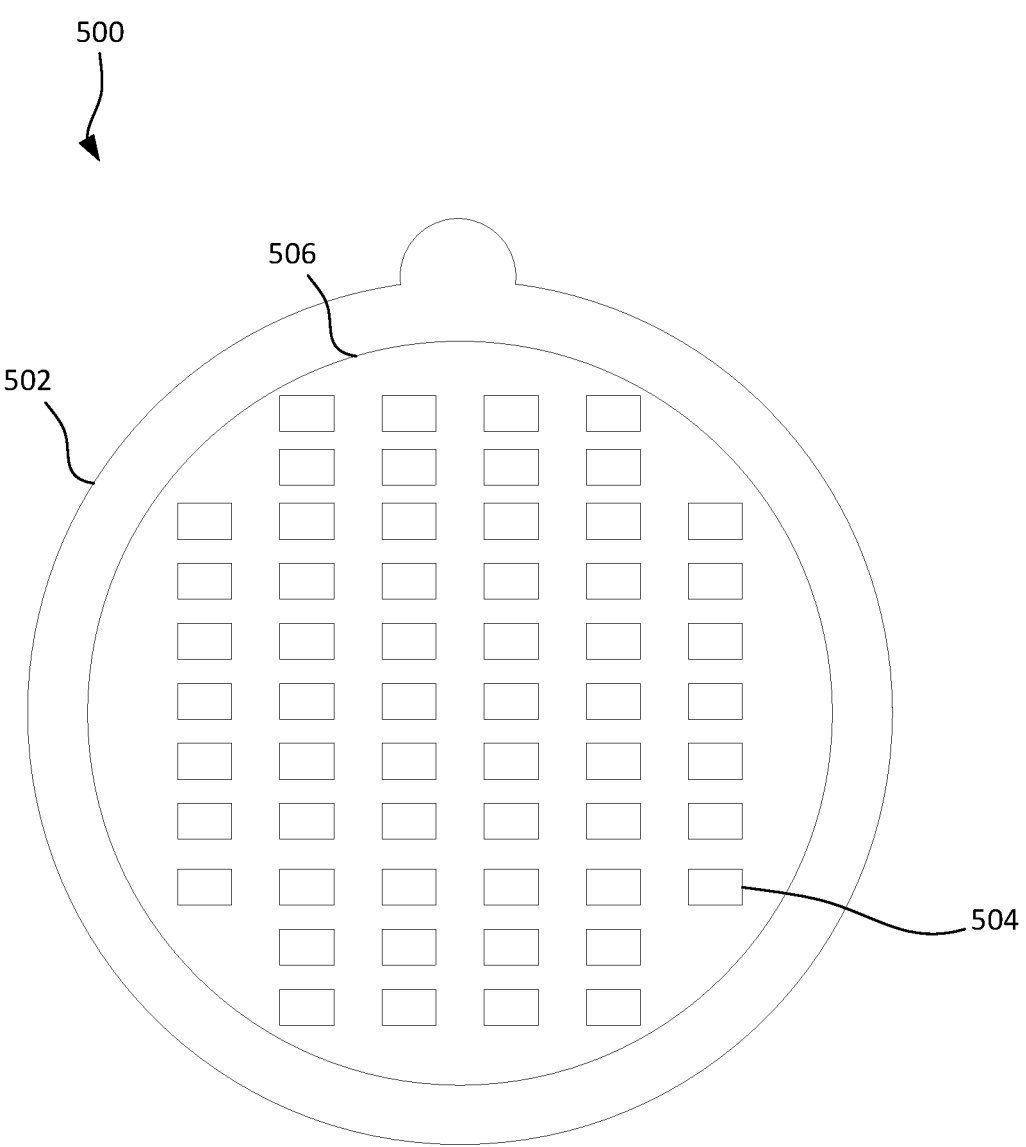
FIG. 5 shows a schematic cross-sectional top plan view of a battery puck according to some embodiments of the present technology.

FIG. 5 illustrates a schematic cross-sectional top plan view of a battery puck 500 according to some embodiments of the present technology. FIG. 5 may include one or more components discussed above with regard to FIGS. 1A and 1B and FIG. 3, and may illustrate further details relating to that diagnostic wafer 100 or 300. Battery puck 500 is understood to include any feature or aspect of battery puck 112b or 312b discussed previously. Battery puck 500 may include a puck body 502 that houses a number of batteries 504. The puck body 502 may be dimensioned to be received within a recess of a diagnostic wafer, such as diagnostic wafer 100 or 200 described above. A bottom surface of the puck body 502 may include a number of electrical contacts (not shown) that are used to electrically couple the battery puck 500 with the diagnostic wafer. The batteries 504 may be provided on a substrate 506 that is disposed within the puck body 502. The batteries 504 may be disposed on one or both sides of the substrate 506. For example, in some embodiments a number of batteries 504 may be provided on a top side of the substrate 506 and a number of batteries 504 may be provided on a bottom side of the substrate 506. Some or all of the batteries 504 may be operated in series and/or in parallel one or more other batteries 504. For example, pairs of the batteries 504 may be coupled in series and/or in parallel with one another. As just one example, the batteries 504 may be 1.5V batteries that are connected in series (e.g., 2 batteries) to reach 3V in total and in parallel to achieve a larger current. Battery puck 500 may include any number of batteries 504. For example, the battery puck 500 may include at least or about 1 battery, at least or about 2 batteries, at least or about 5 batteries, at least or about 10 batteries, at least or about 20 batteries, at least or about 30 batteries, at least or about 40 batteries, at least or about 50 batteries, at least or about 60 batteries, at least or about 70 batteries, at least or about 80 batteries, at least or about 90 batteries, at least or about 100 batteries, or more. A number and/or arrangement of batteries 504 on a top side of the substrate 506 may match or be different than that of the bottom side of the substrate 506. While illustrated with batteries 504 being arranged in a number of rows and columns, it will be appreciated that the batteries 504 may be arranged in any pattern in various embodiments.

The batteries 504 may be any type of battery that may withstand chamber conditions and will not be prone to explosion. For example, the batteries 504 may be selected to be operable in temperatures of at least or about 100° C., at least or about 125° C., at least or about 150° C., at least or about 175° C., at least or about 200° C., or more. In some embodiments, the batteries 504 may be solid state batteries. In some embodiments, some or all of the puck body 502 may be formed from and/or coated with a dielectric and/or composite material that is chemically resistant. For example, a chemically resistant material may be applied via atomic layer deposition and/or other process to one or more surfaces of the puck body 502. Such a coating may help protect battery puck 500 from chemical interactions that may cause degradation and/or erosion of the puck body 502.

During testing operations, the battery puck 500 may be operated in continuous power mode and/or a pulse mode. In the continuous power mode, power may be supplied from one or more battery pucks 500 to the data logger pucks and/or sensor pucks continuously, which may enable continuous sampling of sensor data. In the pulse mode, the batteries 504 may be pulsed or powered on for a short period of time (such as between or about 1 second and 10 second, between or about 2 seconds and 9 seconds, between or about 3 seconds and 8 seconds, between or about 4 seconds and 7 seconds, or between about 5 seconds and 6 seconds) and be allowed to recover for a preset period of time (such as between or about 5 seconds and 30 seconds, between or about 10 seconds and 25 seconds, or between or about 15 seconds and 20 seconds). For example, a 0.1 Hz duty cycle may provide a 4 second pulse time and a 6 second recovery time, a 0.05 Hz duty cycle may provide a 4 second pulse time and a 16 second recovery time, and/or a 0.066 Hz duty cycle may provide a 4 second pulse time and an 11 second recovery time, however, other duty cycles for pulse operation may be utilized in various embodiments. During the pulse time, the sensor pucks may be powered on to take measurements, which may be transmitted to the data logger puck prior to power being cut off during the recovery time. The pulse cycles may be repeated any number of times during a testing/processing operation. By operating the batteries 504 in the pulse mode, battery life of the battery puck 500 may be extended as compared to operation in the continuous mode. As such, pulse mode operation may be particularly advantageous in longer testing operations. The batteries 504 of the battery puck 500 may be charged by coupling the electrical contacts with a charging device in some embodiments. In other embodiments, the batteries 504 of the battery puck 500 may be charged wirelessly.

Figure 6:
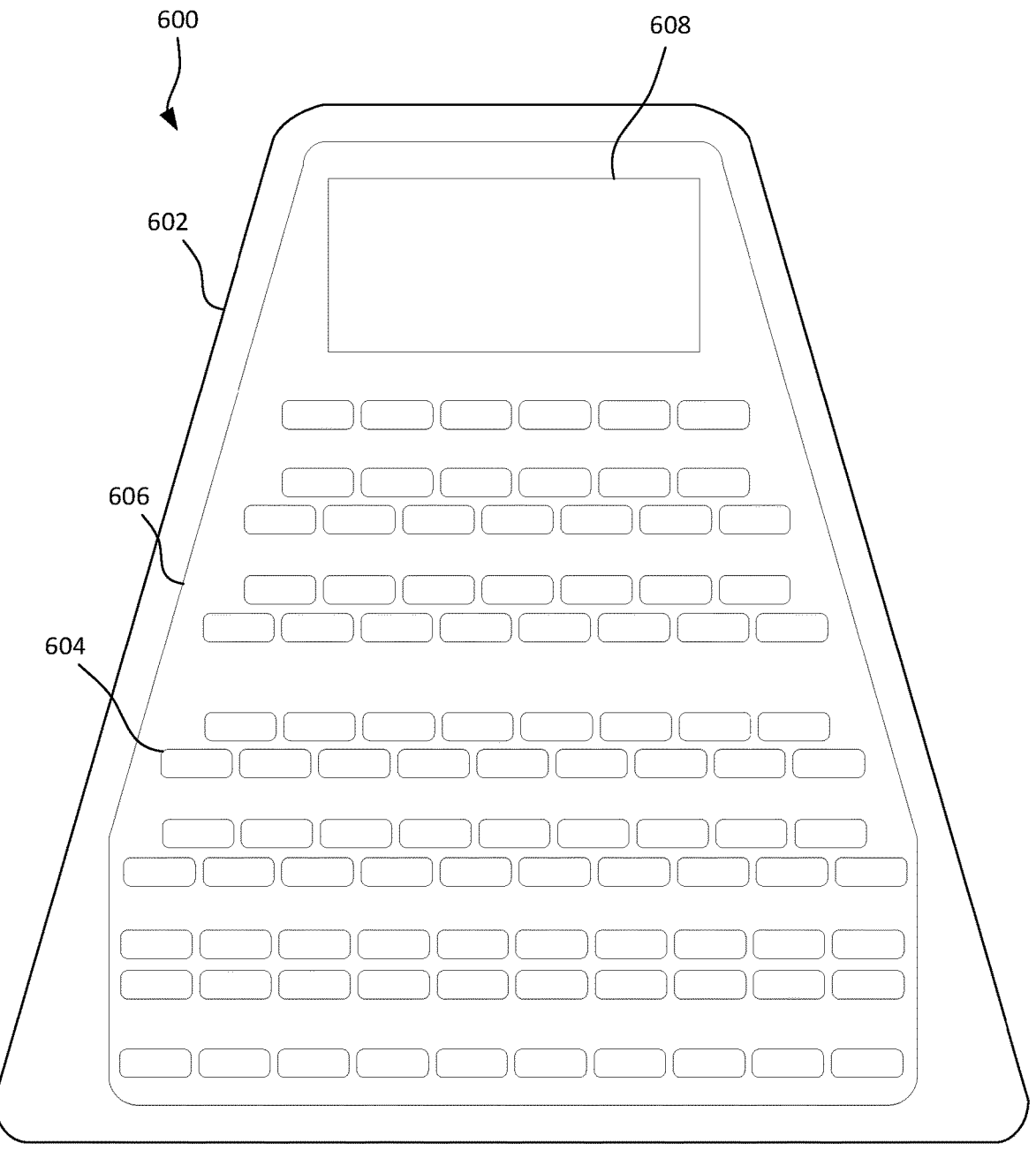
FIG. 6 shows a schematic cross-sectional top plan view of a battery puck according to some embodiments of the present technology.

FIG. 6 illustrates a schematic cross-sectional top plan view of a battery puck 600 according to some embodiments of the present technology. FIG. 6 may include one or more components discussed above with regard to FIGS. 1A and 1B, FIG. 3, and FIG. 5, and may illustrate further details relating to that diagnostic wafer 100 or 300. Battery puck 600 is understood to include any feature or aspect of battery puck 112b, 312b, or 500 discussed previously. Battery puck 600 may include a puck body 602 that houses a number of batteries 604. The puck body 602 may be dimensioned to be received within a recess of a diagnostic wafer, such as diagnostic wafer 300 described above. For example, the puck body 602 may be generally trapezoidal shaped (possibly with rounded corners) to match a recess formed in diagnostic wafer 300. For example, a thinner end of the trapezoidal shape may be positioned toward a center of the wafer body, while a larger end of the trapezoidal shape may be positioned proximate the outer periphery of the wafer body. Such an orientation of the trapezoidal shape may enable the battery puck 600 to utilize a greater amount of surface area of a diagnostic wafer, which may enable a size and/or number of batteries 604 provided in the battery puck 600 to be increased. This may enable a given battery puck 600 to be usable in longer testing applications. A bottom surface of the puck body 602 may include a number of electrical contacts (not shown) that are used to electrically couple the battery puck 600 with the diagnostic wafer. The batteries 604 may be provided on the substrate 606 that is disposed within the puck body 602. The batteries 604 may be disposed on one or both sides of the substrate 606. For example, in some embodiments a number of batteries 604 may be provided on a top side of the substrate 606 and a number of batteries 604 may be provided on a bottom side of the substrate 606. Battery puck 600 may include any number of batteries 604. For example, the battery puck 600 may include at least or about 1 battery, at least or about 2 batteries, at least or about 5 batteries, at least or about 10 batteries, at least or about 20 batteries, at least or about 30 batteries, at least or about 40 batteries, at least or about 50 batteries, at least or about 60 batteries, at least or about 70 batteries, at least or about 80 batteries, at least or about 90 batteries, at least or about 100 batteries, or more. The substrate 606 may have generally the same shape (i.e., trapezoidal) as the battery puck 600 in some embodiments. In other embodiments, the substrate 606 may be generally hexagonal in shape as illustrated in FIG. 6. In some embodiments, the substrate 606 may be or may include a PCB that mechanically supports and electrically connects the batteries 604 and/or other electrical components of the battery puck 600. For example, the PCB may include a number of circuit traces, wires, and/or other connections that facilitate the exchange of electronic signals between the various electrical components of the battery puck 600. In some embodiments, the battery puck 600 http://en.wikipedia.org/wiki/Electronic_components may include an electronic chip 608 that may include one or more electronic components. The electronic chip 608 may be mounted on and/or otherwise coupled with the substrate 606. For example, the electronic chip 608 may be positioned on a PCB that forms substrate 606. The electronic chip 608 may include a voltage converter and/or processor, which may be electrically coupled with the batteries 604 via the PCB and may facilitate transfer of power to the other pucks and/or may control an operational mode of the battery puck 600. For example, a data-logger puck may send a command to the processor that causes the battery puck 600 to operate in a pulse mode by selectively powering each sensor puck on and off.

Figure 7:
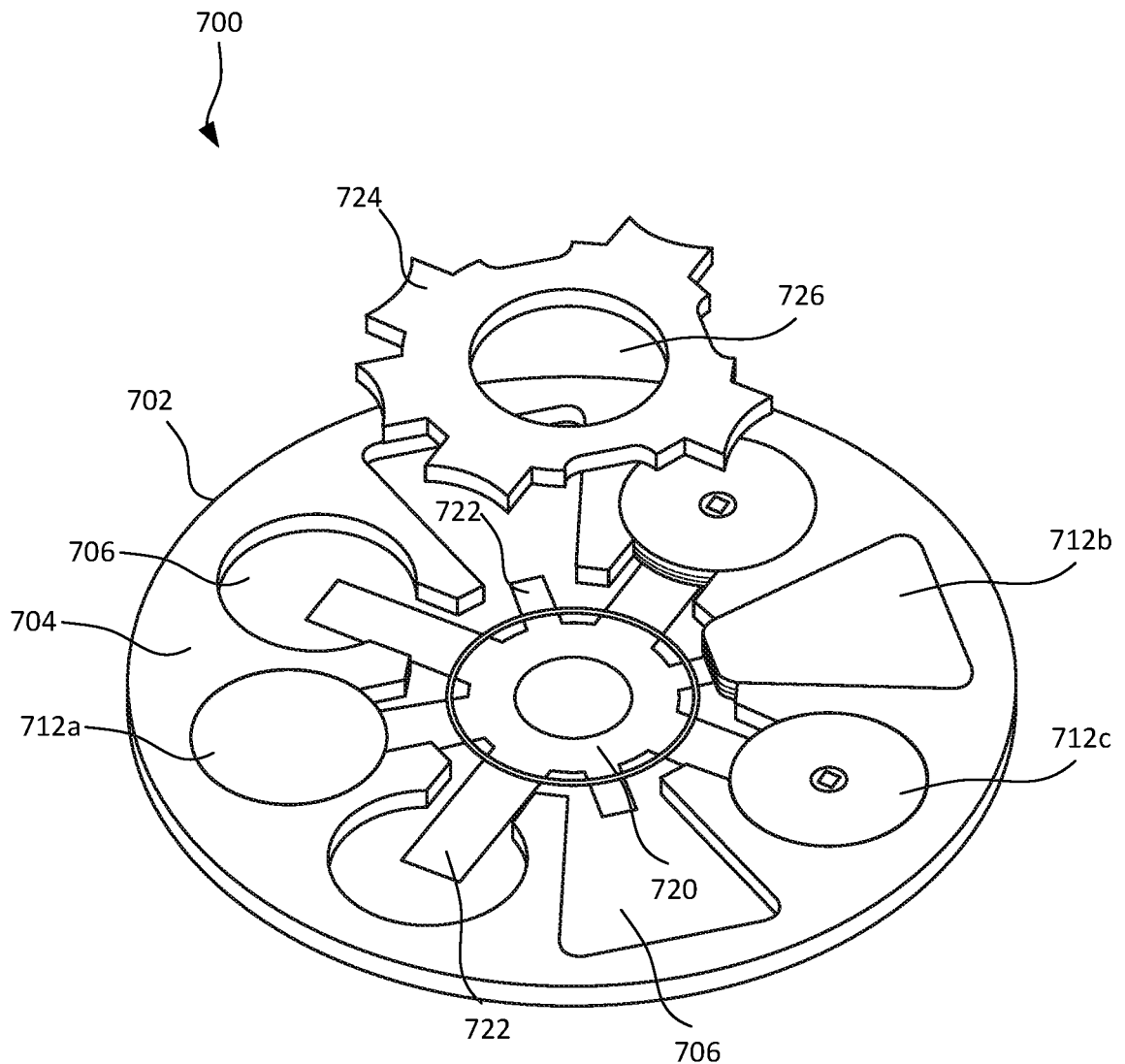
FIG. 7 shows a top isometric view of a diagnostic wafer according to some embodiments of the present technology.

FIG. 7 illustrates a top isometric view of an exemplary embodiment of a diagnostic wafer 700. FIG. 7 may include one or more components discussed above with regard to FIGS. 1A-6, and may illustrate further details relating to diagnostic wafers and/or pucks described elsewhere herein. Diagnostic wafer 700 is understood to include any feature or aspect of diagnostic wafer 100, 200, or 300 discussed previously. For example, diagnostic wafer 700 may include a wafer body 702 that defines a number of recesses 706 that may each receive one of a number of pucks 712. For example, a top surface 704 of the wafer body 702 may define a number of recesses 706 that may each serve as seating locations for one of a number of pucks 712. The recesses 706 may be any shape. For example, the recesses 706 that receive a data-logger puck 712a and/or a sensor puck 712c may have generally circular shapes, while recesses 706 for battery pucks 712b may have generally trapezoidal shapes (regular and/or irregular, possibly with rounded corners). The generally trapezoidal recesses 706 may be larger than the circular recesses 706 and may enable larger and/or more powerful battery pucks 712b to be interfaced with the diagnostic wafer 700. By utilizing irregular trapezoidal shaped recesses 706 as illustrated, the battery pucks 712b may be insertable within the recesses 706 in only a single orientation, which may eliminate the need for other alignment mechanisms. In some embodiments, each recess 706 may be a distinct feature with clearly demarcated boundaries, while in other embodiments some or all of the recesses 706 may connect with one another to form a larger recess.

As illustrated, the diagnostic wafer 700 includes one data logging puck 712a that is coupled with three battery pucks 712b and five sensor pucks 712c, however the diagnostic wafer 700 may include any number of each type of puck 712 in various embodiments. In some embodiments, the diagnostic wafer 700 may omit the data logging puck 712a and instead may include one or more wireless antennas disposed in the sensor pucks 712c and/or the wafer body 702 that transmit data from the sensor pucks 712a to a remote computing device. The pucks 712 may be provided in any arrangement within the diagnostic wafer 700 to meet the particular monitoring needs of a particular testing operation.

The wafer body 702 may include one or more PCBs 720 that are disposed within an upward facing surface of the wafer body 702. For example, in some embodiments, each recess 706 may include a dedicated PCB 720, while in other embodiments one or more recesses 706 may share a single PCB 720. As illustrated, a single PCB 720 may be provided that electrically couples with each of the recesses 706. Portions of the PCB 720 may extend into each recess 706 such that the pucks 712 may be electrically coupled with one another when positioned within the recesses 706. For example, each recess 706 includes a branch 722 of the PCB 720, which enables contacts of the pucks 712, such as spring-loaded contacts, glass or ceramic feedthroughs, and the like, to be interfaced with corresponding connectors on the PCB 720. For example, each branch 722 may extend far enough into each recess 706 such that the connectors on the PCB 720 are in alignment with contacts positioned on a bottom surface of each of the pucks 712. In some embodiments, rather than using contacts positioned on the bottom surfaces of the pucks 712 the lateral edges of each of the pucks 712 may include electrical contacts that may engage with corresponding connectors on the contact PCB 720 (which is common in this case, but also may be individual). In order to isolate the PCB 720 from the gas present in the process chamber, a dedicated top cover 724 may be provided, which represents a specially shaped portion of the wafer body 702. A shape of the top cover 724 may be designed to match the design of the wafer body 702 and recess/puck arrangement. The top cover 724 may enable the top surface 704 of the diagnostic wafer 700 to be substantially planar to prevent any flow, pressure, and/or temperature non-uniformity issues from arising during testing operations. In some embodiments, the top cover 724 may define one or more apertures 726. For example, the top cover 724 may define a central aperture 726 that is sized and shaped to enable a puck 712 to be seated within an interior of the top cover 724. For example, the aperture 726 may be generally circular (or other shape) to enable a sensor puck 712c and/or data logging puck 712a to be seated within the aperture 726. In other embodiments, the aperture 726 may be generally trapezoidal (or other shape) to enable a battery puck 712b to be seated within the aperture 726. In embodiments that include aperture 726, a bottom or a lateral surface of the diagnostic puck 712 may include one or more electrical contacts that enable the puck 712 inserted therein to be electrically coupled to the contact PCB 720.

Figure 8:
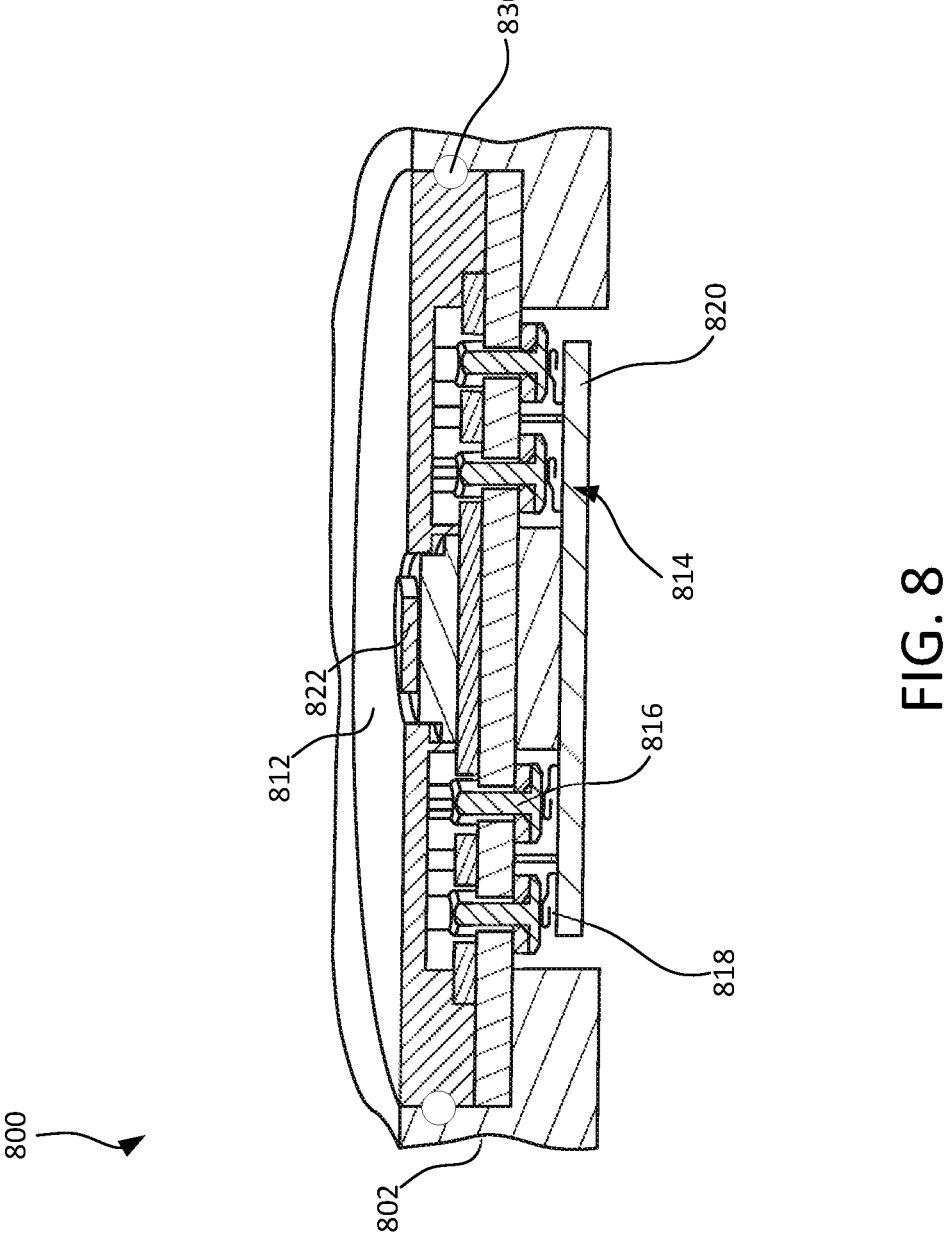
FIG. 8 shows a partial cross-sectional side elevation view of a diagnostic wafer in connection with a sensor puck via an individual contact PCB and spring-loaded contacts according to some embodiments of the present technology.

FIG. 8 illustrates a partial cross-sectional side elevation view of an exemplary embodiment of a diagnostic wafer 800. FIG. 8 may include one or more components discussed above with regard to FIGS. 1A-7, and may illustrate further details relating to diagnostic wafers and/or pucks described elsewhere herein. Diagnostic wafer 800 is understood to include any feature or aspect of diagnostic wafer 100, 200, 300, or 700 discussed previously. For example, diagnostic wafer 800 may include a wafer body 802 that defines a number of recesses that may each receive one of a number of pucks 812. A bottom of the wafer body 802 may include one or more PCBs 820 and/or other connector boards, with at least a portion of a PCB 820 being positioned within a bottom surface of each recess. This may enable electrical contacts of a puck 812 to be interfaced with the PCB 820 to electrically couple the pucks 812 with one another, which may enable battery pucks to power data logging pucks and/or sensor pucks and may facilitate data transfer between the various pucks 812.

As illustrated in FIG. 8, each puck 812 may include one or more spring-loaded contacts 814 that may electrically couple the puck 812 with the PCB 820 when the puck 812 is inserted within the recess. The spring-loaded contacts 814 may include spring-loaded pins, screws, or other features. For example, each spring-loaded contact 814 may include a conductive screw 816 that may extend through at least a portion of a bottom surface of the puck 812 and that is in contact with internal electrical components of the puck 812. A conductive spring finger 818 (or other spring) may be positioned against a head of the screw 816. When the puck 812 is inserted into a recess, the spring finger 818 may contact a corresponding connector on the PCB 820 and may establish contact between the PCB 820 and screw 816/puck 812. The use of spring-loaded contacts 814 may help ensure a reliable connection is made between the puck 812 and PCB 820 without the contacts 814 being damaged during insertion of the puck 812 into the recess. Additionally, while shown with the spring fingers 818 being positioned at a bottom of each screw 816, some embodiments may reverse the orientation such that the spring finger 818 is disposed within a body of the puck 812 with a distal end of the screw 816 protruding downward to contact an upper surface of the PCB 820. In some embodiments, spring-loaded contacts may be used to establish contact between the sides of a puck 812 and a PCB. An edge of the puck 812 may include an O-ring 830 and/or other seal, which may help create a vacuum tight fit of the puck 812 within a recess and may help retain the puck 812 within the recess during testing operations.

While illustrated as a sensor puck having at least one sensor 822 (although any number of sensors may be included in various embodiments), it will be appreciated that similar contact layouts may be used to couple the battery pucks and/or data logging pucks to the PCB 820 in a similar manner. As illustrated, each puck 812 may include four different spring-loaded contacts 814, although any number of contacts 814 may be used in various embodiments. The use of four contacts 814 may enable a separate contact 814 to be used for receiving and/or transmitting electrical signals and for coupling negative and positive terminals of each of a number of battery pucks with each data logger puck and/or sensor puck.

Figure 9B:
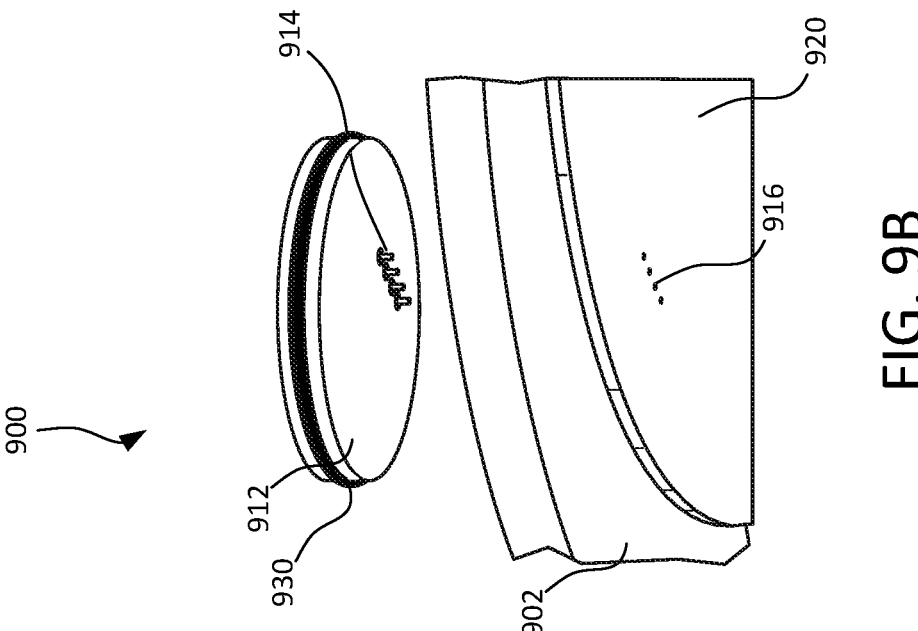
FIG. 9B shows a partial exploded bottom isometric view of the diagnostic wafer and sensor puck of FIG. 9A according to some embodiments of the present technology.
Figure 9A:
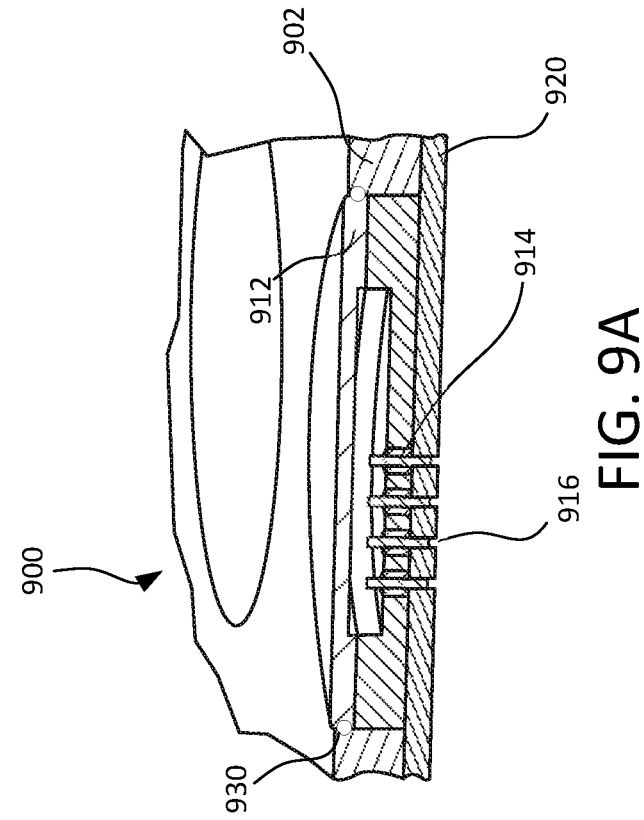
FIG. 9A shows a partial cross-sectional side elevation view of a diagnostic wafer in connection with a sensor puck via a common contact PCB and isolating feedthrough contacts according to some embodiments of the present technology.

FIG. 9A illustrates a partial cross-sectional side elevation view of an exemplary embodiment of a diagnostic wafer 900. FIG. 9A may include one or more components discussed above with regard to FIGS. 1A-8, and may illustrate further details relating to diagnostic wafers and/or pucks described elsewhere herein. Diagnostic wafer 900 is understood to include any feature or aspect of diagnostic wafer 100, 200, 300, 700, or 800 discussed previously. For example, diagnostic wafer 900 may include a wafer body 902 that defines a number of recesses that may each receive one of a number of pucks 912. A bottom of the wafer body 902 may include one or more PCBs 920 and/or other connector boards, with at least a portion of a PCB 920 being positioned within a bottom surface of each recess. This may enable electrical contacts of a puck 912 to be interfaced with the PCB 920 to electrically couple the pucks 912 with one another, which may enable battery pucks to power data logging pucks and/or sensor pucks and may facilitate data transfer between the various pucks 912.

As illustrated in FIGS. 9A and 9B, each puck 912 may include one or more feedthrough contacts 914, such as glass or ceramic feedthroughs, that may electrically couple the puck 912 with the PCB 920 when the puck 912 is inserted within the recess. For example, the feedthroughs 914 may extend through at least a portion of a bottom surface of the puck 912 and that is in contact with internal electrical components of the puck 912. When the puck 912 is inserted into a recess, the feedthroughs 914 may each be received within a corresponding receptacle 916 formed in a bottom surface of the recess to establish contact between the PCB 920 and feedthrough 914. As illustrated, each puck 912 may include four different feedthroughs 914, although any number of feedthroughs 914 may be utilized in various embodiments. The use of four feedthroughs 914 may enable a separate feedthrough 914 to be used for receiving and/or transmitting electrical signals and for coupling negative and positive terminals of each of a number of battery pucks with each data logger puck and/or sensor puck. An edge of the puck 912 may include an O-ring 930 and/or other seal, which may help create a vacuum tight fit of the puck 912 within a recess and may help retain the puck 912 within the recess during testing operations.

In some embodiments, the diagnostic wafers described herein may not include a data logging puck. In such embodiments, measurements and/or other data from the sensor pucks may be transmitted wirelessly to a remote computing device (outside of the chamber) while the diagnostic wafer is positioned within the chamber. This may enable real-time measurements to be tracked, while eliminating the need for a data logging puck (although some embodiments may still include a data logging puck to provide backup storage). For example, one or more of the pucks and/or the wafer may include a wireless antenna that may transmit the data to a remote computing device. In some embodiments, each of the sensor pucks may include a wireless communication antenna that enables each sensor puck to communicate directly with the remote computing device. Alternatively, or additionally, a wireless antenna may be provided in the diagnostic wafer body. For example, a wireless antenna may be coupled with a PCB or other signal interface of the diagnostic wafer body that enables the measurements and/or other data from the sensor pucks to be collected and transmitted to the remote computing device via the antenna provided within the diagnostic wafer body.

In some embodiments, a viewing window (such as a quartz window) may be provided in a chamber wall to facilitate transmission of wireless signals between the remote computing device and the sensor puck antennas and/or the diagnostic wafer antenna. In some embodiments, an antenna may be embedded within a wall of the chamber to facilitate communication between the wafer and the remote computer. For example, the chamber wall antenna may relay signals from the sensor puck antennas and/or the diagnostic wafer antenna to the remote computing device and vice versa. The signal transmitted by the sensor puck antennas and/or the diagnostic wafer antenna may be between 1 MHz and 80 GHz in various embodiments, with a frequency of the signal being selected based on the processing operation conditions and/or chamber design to minimize interference with the transmitted signal. As just one example, a frequency may be at least 5× higher than a maximum plasma frequency to avoid signal interference.

Figure 10:
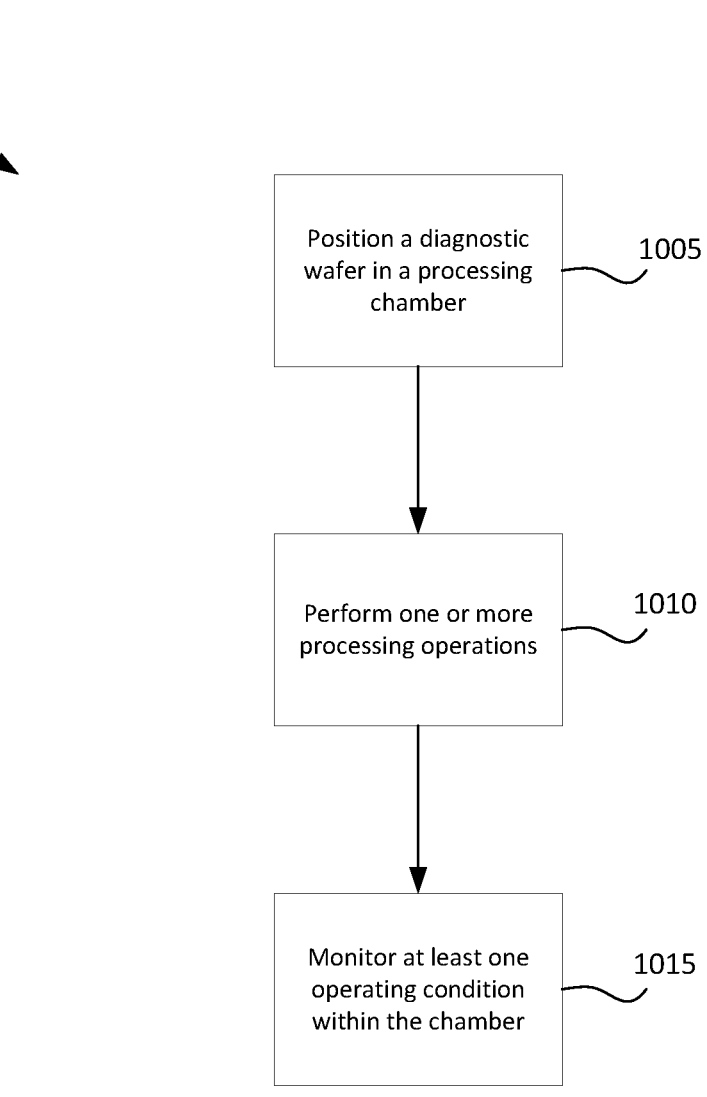
FIG. 10 shows operations of an exemplary method of monitoring conditions within a semiconductor operating chamber according to some embodiments of the present technology.

FIG. 10 shows operations of an exemplary method 1000 of monitoring conditions within a semiconductor processing chamber according to some embodiments of the present technology. The method may be used to monitor a number of different conditions within a semiconductor processing chamber, including, but not limited to, a temperature within the semiconductor processing chamber, a pressure within the semiconductor processing chamber, an ion and electron current within the semiconductor processing chamber, an ion and electron energy within the semiconductor processing chamber, a plasma potential within the semiconductor processing chamber, a light emission within the semiconductor processing chamber, etc. Method 1000 may be performed using a diagnostic wafer, similar to diagnostic wafer 100, 200, 300, 700, 800, or 900 described above. Method 1000 may include a number of optional operations, which may or may not be specifically associated with some embodiments of methods according to the present technology.

Method 1000 may include optional operations prior to initiation of method 1000, or the method may include additional operations. For example, method 1000 may include operations performed in different orders than illustrated. In some embodiments, method 1000 may include positioning a diagnostic wafer on a substrate support of a semiconductor processing chamber at operation 1005. The diagnostic wafer may be similar to those described herein and may include a wafer body defining a plurality of recesses, at least one battery puck, at least one sensor puck, and optionally at least one data logging puck. Each of the pucks may be positionable within one of the plurality of recesses. The sensor pucks used may be selected and arranged within the wafer to measure one or more operating conditions within the chamber about a surface of the wafer. In some embodiments, the pucks may be provided in any arrangement within the recesses, which enables customization of the sensing capabilities of the wafer for measuring different chamber conditions. One or more processing operations may be performed within the semiconductor processing chamber at operation 1010. In some embodiments, the processing operations may include flowing one or more precursors into a processing chamber. For example, the precursor may be flowed into a processing region of the chamber. In some embodiments the precursor may be or include a carbon-containing precursor. A plasma may be generated of the precursors within the processing region, such as by providing RF power to the faceplate to generate a plasma. Material formed in the plasma, such as a carbon-containing material, may be deposited on the substrate.

At least one operating condition may be monitored within the semiconductor processing chamber using the sensor pucks at operation 1015. For example, the sensor pucks may monitor a temperature within the semiconductor processing chamber, a pressure within the semiconductor processing chamber, an ion and electron current within the semiconductor processing chamber, an ion and electron energy within the semiconductor processing chamber, a plasma potential within the semiconductor processing chamber, and/or a light emission within the semiconductor processing chamber. The various pucks may be powered continuously and/or in a pulse mode using the battery pucks. Data from the sensor pucks may be recorded using at least one data logging puck in some embodiments. For example, the data logging puck may receive data via a wired connection (such as a bus or other circuit within the wafer) and/or wirelessly from the sensor pucks. In such embodiments, after the data is logged and the processing operations are halted, the data logging puck may be removed from the chamber and interfaced with a computing device. For example, the data logging puck may be physically (such as via a dock or other connector) and/or wirelessly coupled with the computing device such that data may be accessed using the computing device. The data may be used to determine whether desired operating conditions are being maintained within the chamber during processing operations. In some embodiments, data from one chamber may be compared to data from another chamber to ensure that the chambers are creating identical or near-identical operating conditions that will create uniform semiconductor substrates within both chambers. Similarly, data from the wafers may be compared from one tool to another to ensure that processing tools are operating in a same manner to ensure substrate film consistency from substrate to substrate.

In some embodiments, data from the sensor pucks may be transmitted wirelessly to a remote computing device (outside of the chamber) while the wafer is positioned within the chamber. This may enable real-time measurements to be tracked. For example, one or more of the pucks and/or the wafer may include a wireless antenna that may transmit the data to a remote computing device. In some embodiments, a viewing window (such as a quartz window) may be provided in a chamber wall to enable the wireless signal to be transmitted outside of the chamber. In some embodiments, an antenna may be embedded within a wall of the chamber to facilitate communication between the wafer and the remote computer. In some embodiments, a transmitter and/or receiver antenna may be positioned on either side of the viewing window to facilitate transmission of signals between the interior of the chamber and the remote computing device. This may be particularly useful when higher frequency signals are used due to the short wavelengths of such signals. The signal transmitted by the wafer may be between 1 MHz and 80 GHz in various embodiments, with a frequency of the signal being selected based on the processing operation conditions and/or chamber design to minimize interference with the transmitted signal. As just one example, a frequency may be at least 5× higher than a maximum plasma frequency to avoid signal interference. In some embodiments, the signal may be between about 2.4 GHz and 5 GHz, such as by using WiFi and/or Bluetooth communications. Some embodiments using wireless antennas to communicate sensor data may include a data logging puck that may also record the sensor data, while other embodiments using wireless antennas may omit a data logging puck entirely.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the opening" includes reference to one or more openings and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A diagnostic wafer for a semiconductor processing chamber, comprising:
    a wafer body defining a plurality of discrete and spaced apart recesses; and
    a plurality of pucks, the plurality of pucks comprising:
        at least one data logging puck positionable within one of the plurality of recesses;
        at least one battery puck positionable within one of the plurality of recesses; and
        at least one sensor puck positionable within one of the plurality of recesses;
        wherein:
        each recess of the plurality of recesses contains a single puck of the plurality of pucks and the at least one data logging puck, the at least one battery puck, and the at least one sensor puck are each insertable within any of the plurality of recesses; and
        a top surface of the at least one sensor puck is exposed through a top surface of the diagnostic wafer.

2. The diagnostic wafer for a semiconductor processing chamber of claim 1, wherein:
    each of the at least one battery puck comprises a plurality of batteries.

3. The diagnostic wafer for a semiconductor processing chamber of claim 1, wherein:
    each of the at least sensor puck comprises at least one sensor selected from the group consisting of:
        temperature sensors, pressure sensors, retarding field energy analyzers (RFEA), plasma probes, optical emission probes for plasma diagnostics, visible light sensors, IR light sensors/cameras.

4. The diagnostic wafer for a semiconductor processing chamber of claim 1, wherein:
    at least some of the at least one data logging puck, the at least one battery puck, and the at least one sensor puck comprise an alignment mechanism that properly orient a respective puck within one of the plurality of recesses.

5. The diagnostic wafer for a semiconductor processing chamber of claim 1, wherein:
    the wafer further comprises a bus that couples each of the at least one battery puck, the at least one sensor puck, and the at least one data logging puck.

6. The diagnostic wafer for a semiconductor processing chamber of claim 1, wherein:
    at least some of the at least one data logging puck, the at least one battery puck, and the at least one sensor puck comprise a ceramic coating.

7. The diagnostic wafer for a semiconductor processing chamber of claim 1, wherein:
    the at least one sensor puck comprises a plurality of sensor pucks; and
    each of the plurality of sensor pucks comprises a same type of sensor.

8. The diagnostic wafer for a semiconductor processing chamber of claim 1, wherein:
    the at least one sensor puck comprises a plurality of sensor pucks; and
    at least some of the plurality of sensor pucks comprise a different type of sensor.

9. A diagnostic wafer for a semiconductor processing chamber, comprising:
    a wafer body defining a plurality of discrete and spaced apart recesses, each of the plurality of recesses comprising a plurality of electrical contacts, wherein the wafer body comprises a connection circuit that electrically couples the plurality of electrical contacts of each of the plurality of recesses with the plurality of electrical contacts of at least one other of the plurality of recesses; and
    a plurality of pucks, the plurality of pucks comprising:
        a plurality of battery pucks positionable within one of the plurality of recesses; and
        a plurality of sensor pucks positionable within one of the plurality of recesses;
        wherein:
        each recess of the plurality of recesses contains a single puck and the plurality of battery pucks and the plurality of sensor pucks are each insertable within any of the plurality of recesses; and
        a top surface of each of the plurality of sensor pucks is exposed through a top surface of the diagnostic wafer.

10. The diagnostic wafer for a semiconductor processing chamber of claim 9, wherein:
    at least one of the plurality of battery pucks comprises a status LED.

11. The diagnostic wafer for a semiconductor processing chamber of claim 9, wherein:
    at least one of the plurality of sensor pucks comprises a status LED.

12. The diagnostic wafer for a semiconductor processing chamber of claim 9, wherein:
    one or both of the wafer body and the plurality of sensor pucks comprise a wireless antenna.

13. The diagnostic wafer for a semiconductor processing chamber of claim 9, wherein:
    a thickness of each of the plurality of sensor pucks matches a depth of each of the plurality of recesses.

14. A method of monitoring conditions within a semiconductor processing chamber, the method comprising:
    positioning a diagnostic wafer on a substrate support of a semiconductor processing chamber, the diagnostic wafer comprising:
        a wafer body defining a plurality of discrete and spaced apart recesses; and
    a plurality of pucks, the plurality of pucks comprising:
        at least one data logging puck positionable within one of the plurality of recesses;
        at least one battery puck positionable within one of the plurality of recesses; and
        at least one sensor puck positionable within one of the plurality of recesses,
        wherein:
        each recess of the plurality of recesses contains a single puck of the plurality of pucks and the at least one data logging puck, the at least one battery puck, and the at least one sensor puck are each insertable within any of the plurality of recesses; and
        a top surface of the at least one sensor puck is exposed through a top surface of the diagnostic wafer;

performing one or more processing operations within the semiconductor processing chamber; and monitoring at least one operating condition within the semiconductor processing chamber using the at least one sensor puck.

15. The method of monitoring conditions within a semiconductor processing chamber of claim 14, further comprising:

recording data associated with the at least one operating condition using the at least one data logging puck.

16. The method of monitoring conditions within a semiconductor processing chamber of claim 14, further comprising:

transmitting data associated with the at least one operating condition to a computing device outside the semiconductor processing chamber.

17. The method of monitoring conditions within a semiconductor processing chamber of claim 14, wherein:

the at least one operating condition comprises one or more selected from the group consisting of a temperature within the semiconductor processing chamber, a pressure within the semiconductor processing chamber, an ion and electron current within the semiconductor processing chamber, an ion and electron energy within the semiconductor processing chamber, a plasma potential within the semiconductor processing chamber, and a light emission within the semiconductor processing chamber.

18. The method of monitoring conditions within a semiconductor processing chamber of claim 14, wherein:

the at least one battery puck is operated in a pulse mode.

19. The diagnostic wafer for a semiconductor processing chamber of claim 1, wherein:

at least a subset of the plurality of pucks are removably coupled within a respective recess of the plurality of recesses.

20. The diagnostic wafer for a semiconductor processing chamber of claim 1, wherein:

the top surface of the at least one sensor puck is configured to remain exposed through the top surface of the diagnostic wafer when inserted within a chamber environment.

* * * * *